(12) United States Patent
Kada et al.

(10) Patent No.: US 9,959,937 B2
(45) Date of Patent: May 1, 2018

(54) MEMORY SYSTEM INCLUDING TEST CIRCUIT

(71) Applicant: TOSHIBA MEMORY CORPORATION, Tokyo (JP)

(72) Inventors: Kenichirou Kada, Yokohama Kanagawa (JP); Shinya Takeda, Yokohama Kanagawa (JP); Toshihiko Kitazume, Kawasaki Kanagawa (JP); Mikio Takasugi, Kawasaki Kanagawa (JP); Nobuhiro Tsuji, Yokohama Kanagawa (JP); Shunsuke Kodera, Yokohama Kanagawa (JP); Tetsuya Iwata, Yokohama Kanagawa (JP); Yoshio Furuyama, Yokosuka Kanagawa (JP); Hirosuke Narai, Yokosuka Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 25 days.

(21) Appl. No.: 15/062,018

(22) Filed: Mar. 4, 2016

(65) Prior Publication Data

US 2017/0062077 A1    Mar. 2, 2017

(51) Int. Cl.
*G11C 29/00* (2006.01)
*G11C 29/38* (2006.01)
(Continued)

(52) U.S. Cl.
CPC ............. *G11C 29/38* (2013.01); *G11C 29/32* (2013.01); *G11C 29/42* (2013.01); *G11C 29/44* (2013.01);
(Continued)

(58) Field of Classification Search
CPC ......... G11C 29/38; G11C 29/32; G11C 29/42; G11C 29/44; G11C 29/52; G11C 29/36; G11C 16/0483; G11C 2207/107
(Continued)

(56) References Cited

U.S. PATENT DOCUMENTS 7,143,229 B2    11/2006    Kamimura
7,574,638 B2    8/2009    Song et al.
(Continued)

FOREIGN PATENT DOCUMENTS

JP    2002323993 A    11/2002
JP    2006-085769    3/2006
(Continued)

OTHER PUBLICATIONS

Taiwan Office Action dated Jan. 13, 2017, filed in Taiwan counterpart Application No. 105103363, 10 pages (with translation).
(Continued)

*Primary Examiner* — Christine T. Tu
(74) *Attorney, Agent, or Firm* — Patterson & Sheridan, LLP

(57) ABSTRACT

A memory system includes a semiconductor memory device, a controller configured to access the semiconductor module, a plurality of pins for connection to the outside of the memory system, the pins configured to receive and output serial data, and a test circuit. When one of the pins receives serial test data, the test circuit converts the serial test data into parallel test data, and outputs the parallel test data to the semiconductor memory device for writing therein, and when the test circuit receives parallel test data written in the semiconductor memory device, the test circuit converts the parallel test data to serial test data, and outputs the serial test data through one of the pins for test of the memory system.

20 Claims, 20 Drawing Sheets

(51) Int. Cl.
*G11C 29/44* (2006.01)
*G11C 29/32* (2006.01)
*G11C 29/42* (2006.01)
*G11C 29/52* (2006.01)
*G11C 16/04* (2006.01)
*G11C 29/36* (2006.01)

(52) U.S. Cl.
CPC .......... *G11C 29/52* (2013.01); *G11C 16/0483* (2013.01); *G11C 29/36* (2013.01); *G11C 2207/107* (2013.01)

(58) Field of Classification Search
USPC ................ 714/719, 733, 734, 735, 724, 824
See application file for complete search history.

(56) References Cited

U.S. PATENT DOCUMENTS

| | | | |
|---|---|---|---|
| 8,102,710 B2 | 1/2012 | Pekny et al. | |
| 2001/0005012 A1* | 6/2001 | Ohshima | G11C 7/1039 257/1 |
| 2008/0189585 A1* | 8/2008 | Sato | G01R 31/31926 714/738 |
| 2013/0139032 A1* | 5/2013 | Tsern | G06F 11/1008 714/764 |
| 2013/0238846 A1* | 9/2013 | Pekny | G06F 12/0246 711/103 |

FOREIGN PATENT DOCUMENTS

| | | |
|---|---|---|
| JP | 2007-172759 | 7/2007 |
| TW | 200935234 A | 8/2009 |

OTHER PUBLICATIONS

TC58NVG0S3HTA00 Datasheet published Aug. 31, 2012, 51 pages.
TC58BVG0S3HTA00 Datasheet published Aug. 31, 2012, 44 pages.
Taiwan Office Action dated May 19, 2017, filed in Taiwan counterpart Application No. 105103363, 14 pages (with translation).

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

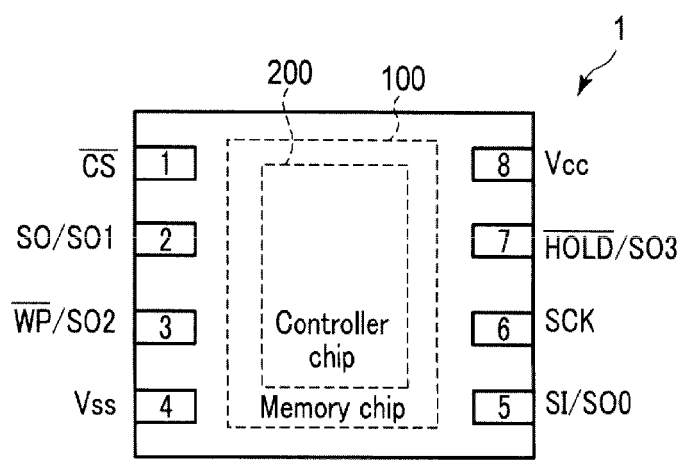

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

NOR Boot

NAND Boot

MEMORY SYSTEM INCLUDING TEST CIRCUIT

CROSS-REFERENCE TO RELATED APPLICATION

This application is based upon and claims the benefit of priority from Japanese Patent Application No. 2015-169392, filed Aug. 28, 2015, the entire contents of which are incorporated herein by reference.

FIELD

An embodiment described herein relates generally to a memory system, in particular, a memory system including a test circuit.

BACKGROUND

A NAND-type flash memory is widely known as one type of a memory device.

DESCRIPTION OF THE DRAWINGS

FIG. 3 illustrates functions of external terminals of the memory system according to the embodiment.

FIG. 4 is an exterior plan view of another memory system according to the embodiment.

FIG. 5 illustrates functions of external terminals of the memory system shown in FIG. 4.

DETAILED DESCRIPTION

Figure 1:
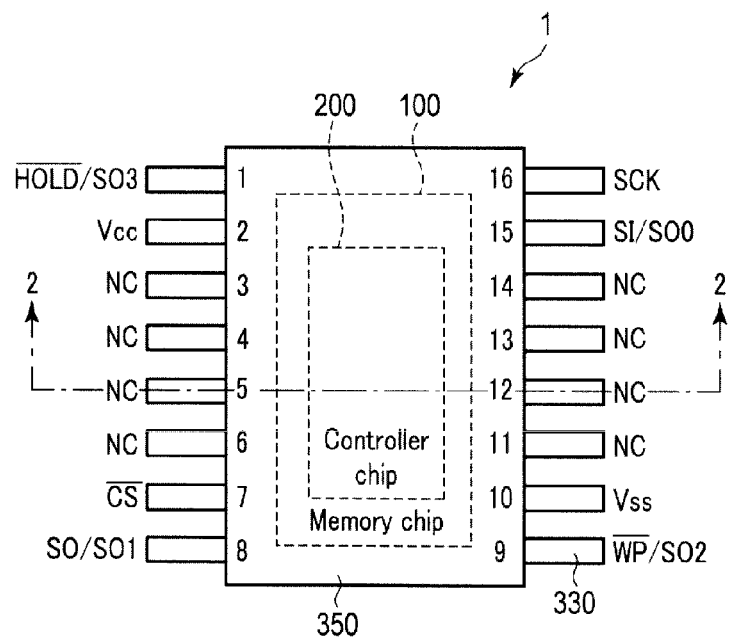
FIG. 1 is an exterior plan view of a memory system according to an embodiment.

An embodiment is directed to providing a memory system capable of testing a memory by using a terminal unit having the number of pins smaller than the number of pins of the memory.

In general, according to an embodiment, a memory system includes a semiconductor memory device, a controller configured to access the semiconductor module, a plurality of pins for connection to the outside of the memory system, the pins configured to receive and output serial data, and a test circuit. When one of the pins receives serial test data, the test circuit converts the serial test data into parallel test data, and outputs the parallel test data to the semiconductor memory device for writing therein, and when the test circuit receives parallel test data written in the semiconductor memory device, the test circuit converts the parallel test data to serial test data, and outputs the serial test data through one of the pins for test of the memory system.

Hereinafter, an embodiment will be described with reference to the drawings. In the following description, elements having the same function and configuration are described with the same reference numerals.

1. Embodiment

A memory system according to an embodiment will be described.

1.1 Configuration 1.1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line 2-2 in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
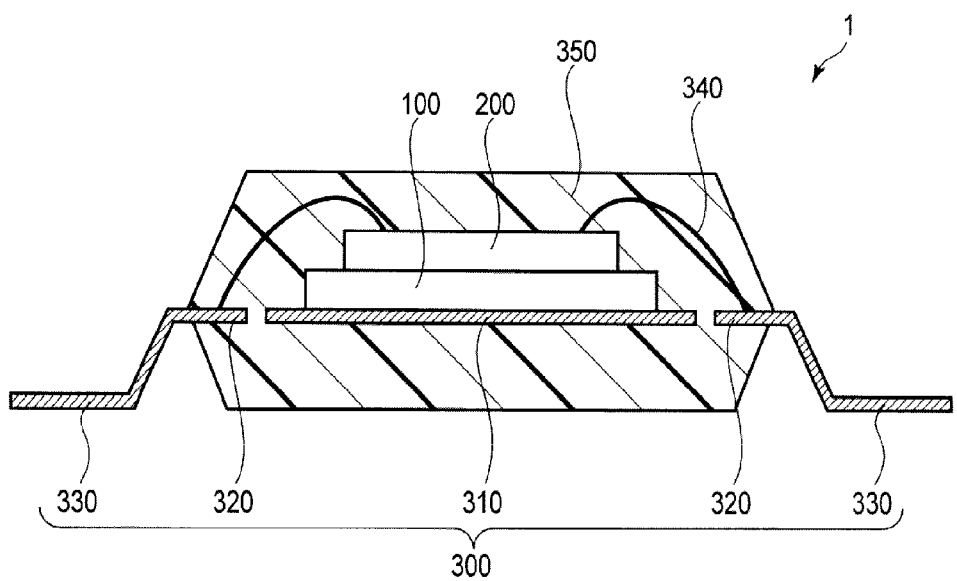
FIG. 2 is a cross-sectional view of the memory system according to the embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including first to sixteenth pins are provided. The memory system 1 performs communication with a host apparatus which controls the memory system 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal /CS. The chip select signal /CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing to the memory chip is inhibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including first to eighth pins are provided. FIG. 5 illustrates functions of the respective pins shown in FIG. 4.

As illustrated, the first pin receives the chip select signal /CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
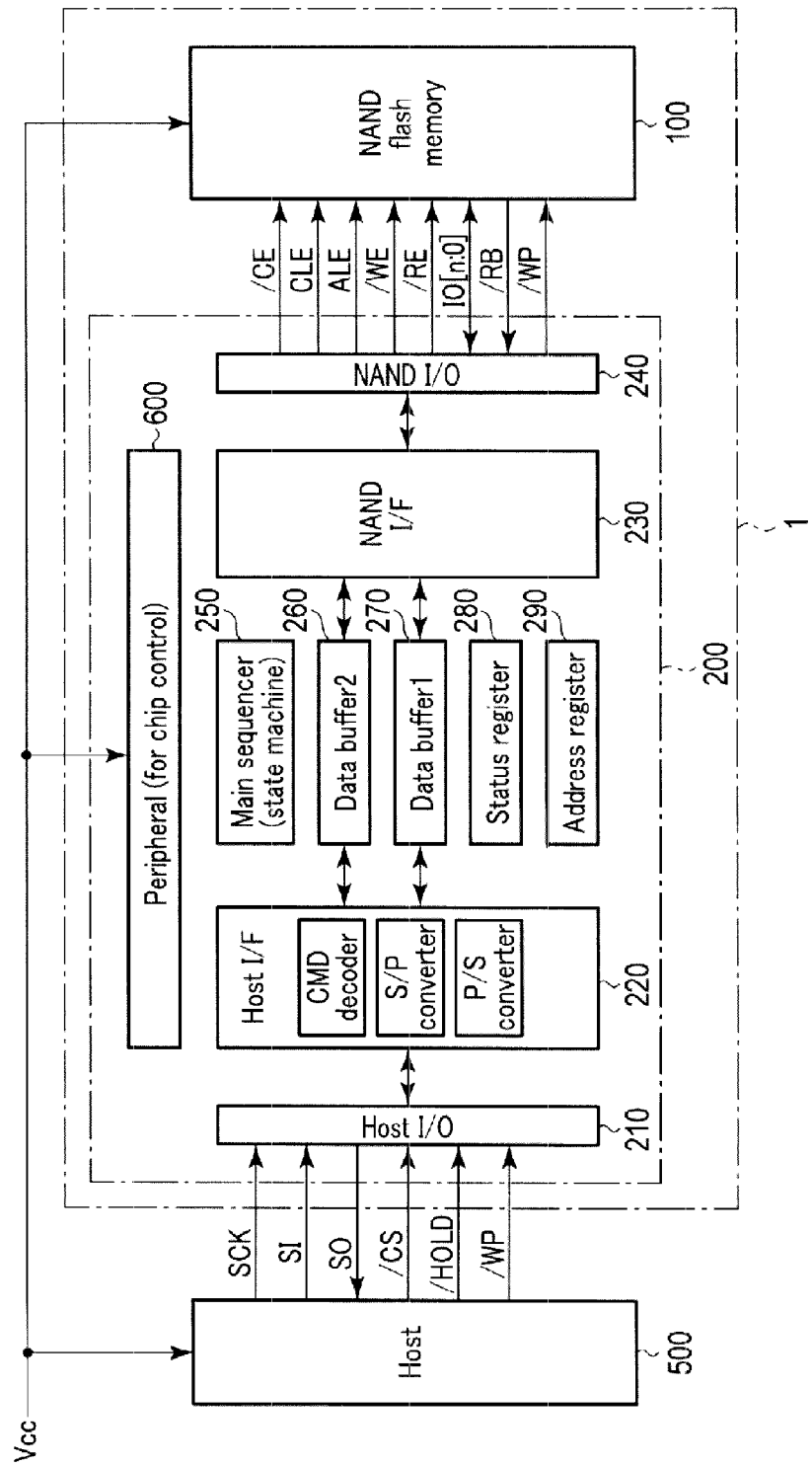
FIG. 6 is a block diagram of the memory system according to the embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and is connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is output from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O contains data which are transmitted and received between the NAND-type flash memory 100 and the controller 200, and includes a command, an address, data to be written, and read data. The signal /WP is a signal for inhibiting data from being written to the NAND-type flash memory 100.

The SPI buses are substantially similar to the ones described with reference to FIGS. 3 and 5.

1.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, and a peripheral circuit 600.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is received in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds data to be written that are received from the host apparatus 500, via the host interface circuit 220. Data read from the NAND-type flash memory 100 is received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 are output to the NAND-type flash memory 100 via the NAND input/output circuit 240. During reading of data, data read from the NAND-type flash memory 100 are transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals/CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a writing operation. The feature table in the status register 280 is updated based on status information received from the NAND-type flash memory 100.

The peripheral circuit 600 receives the power supply voltage Vcc from an external device, transmits the voltage to each circuit block, and performs other control which is necessary in an operation of the controller 200.

1.1.3 Configuration of NAND-Type Flash Memory 100

Figure 7:
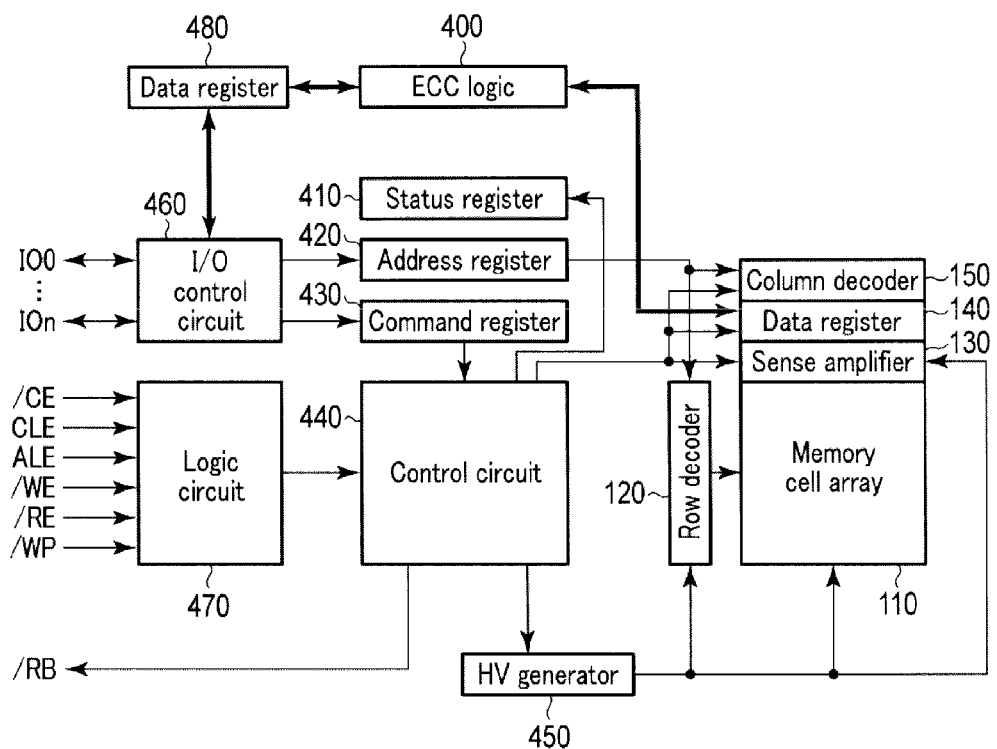
FIG. 7 is a block diagram of a semiconductor memory device according to the embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, an error correction code (ECC) circuit 400, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of reading and writing data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed on a per sector basis. Therefore, the management data includes ECC data which are prepared for one sector. Erasing of data is collectively performed in units of a plurality of pages, referred to as a block.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds data to be written or read data corresponding to one page.

The column decoder 150 decodes a column address of a column of the memory cell array 110. Based on a decoded result, data are transmitted to the data register 140 during writing of data, and data are read from the data register 140 during reading of data.

The ECC circuit 400 performs error detection and error correction processes. More specifically, during writing of data, the ECC circuit 400 generates parity for each sector based on data received from the controller 200, and transmits the parity and net data to the data register 140. During reading of data, the ECC circuit 400 generates a syndrome for each sector based on parity included in data transmitted from the data register 140, and detects the presence or absence of an error. If an error is detected, a bit position thereof is specified, and the error is corrected. The number of error bits which can be corrected for each sector is, for example, 8 bits per sector in the present embodiment. The ECC circuit 400 may output the number of error bits detected in each sector to the status register 410 as status information.

The logic circuit 470 receives the signals /CE, CLE, ALE, /WE, /RE, and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating the number of error bits provided from the ECC circuit 400, and information indicating whether or not a writing operation and a reading operation is successful (passed) or unsuccessful (failed), provided from the control circuit 440.

The control circuit 440 controls the NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

1.2 Operations

Next, data reading, writing, and erasing operations in the memory system according to the present embodiment will be described, focusing on signals which are transmitted and received via the SPI buses and the NAND buses.

1.2.1 Reading Operation

First, the reading operation will be described. The reading operation includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the above (1) are read to the host apparatus 500.

Figure 8:
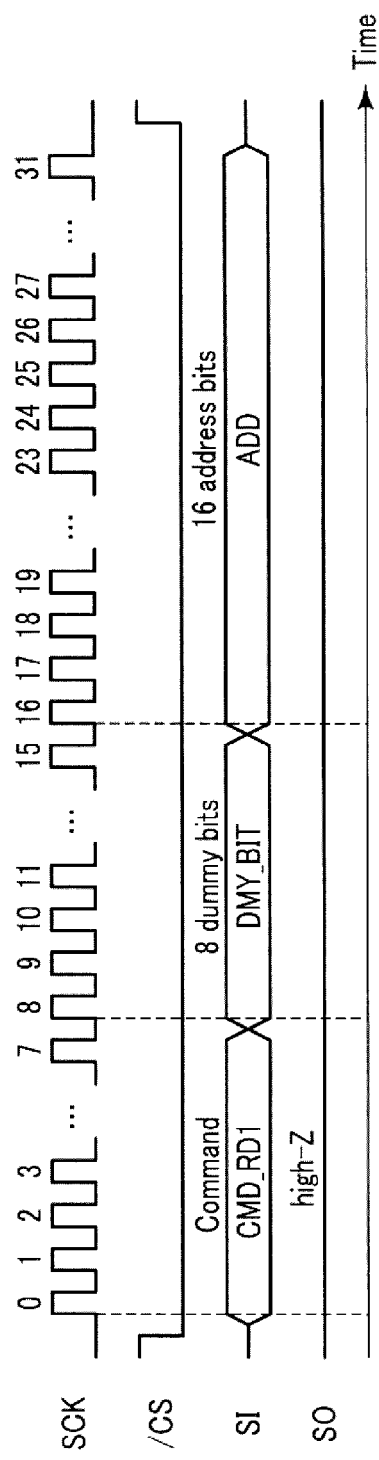
FIGS. 8-11 are timing charts of various signals during reading of data in the memory system according to the embodiment.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input in subsequent 16 clock cycles is an address signal.

Figure 9:
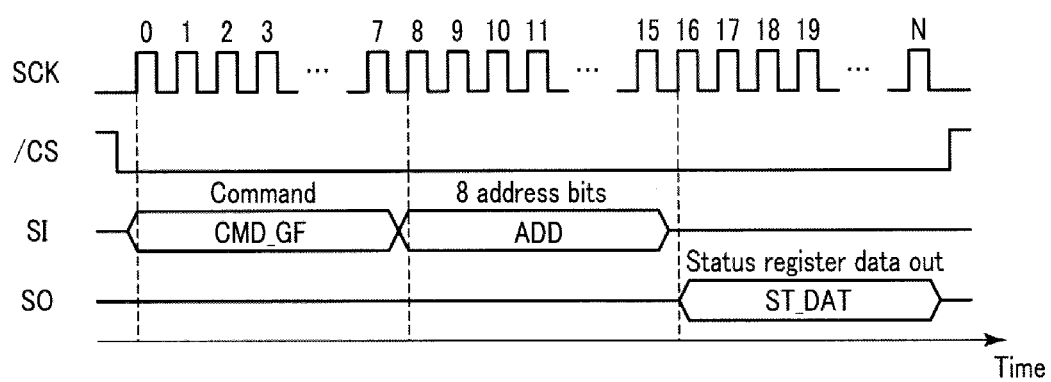

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is in the feature table, and naturally designates a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
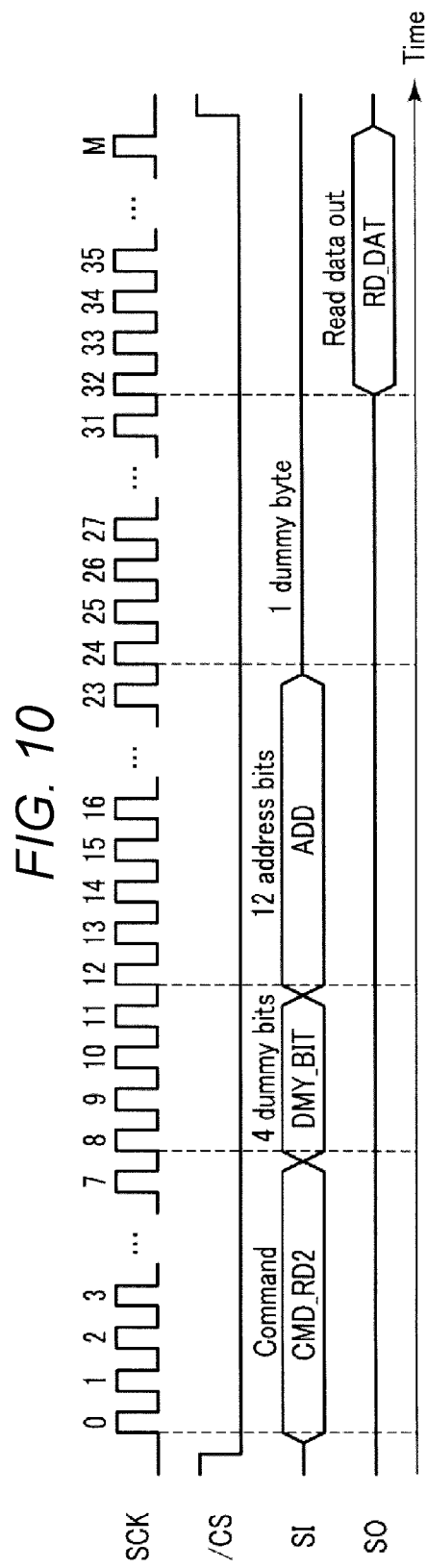

If the received status data ST_DAT indicates that the memory system 1 is in a ready state, the operation in the step (3) is performed. FIG. 10 is a timing chart of various signals on the SPI buses during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270 of the controller 200, and designates a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 11:
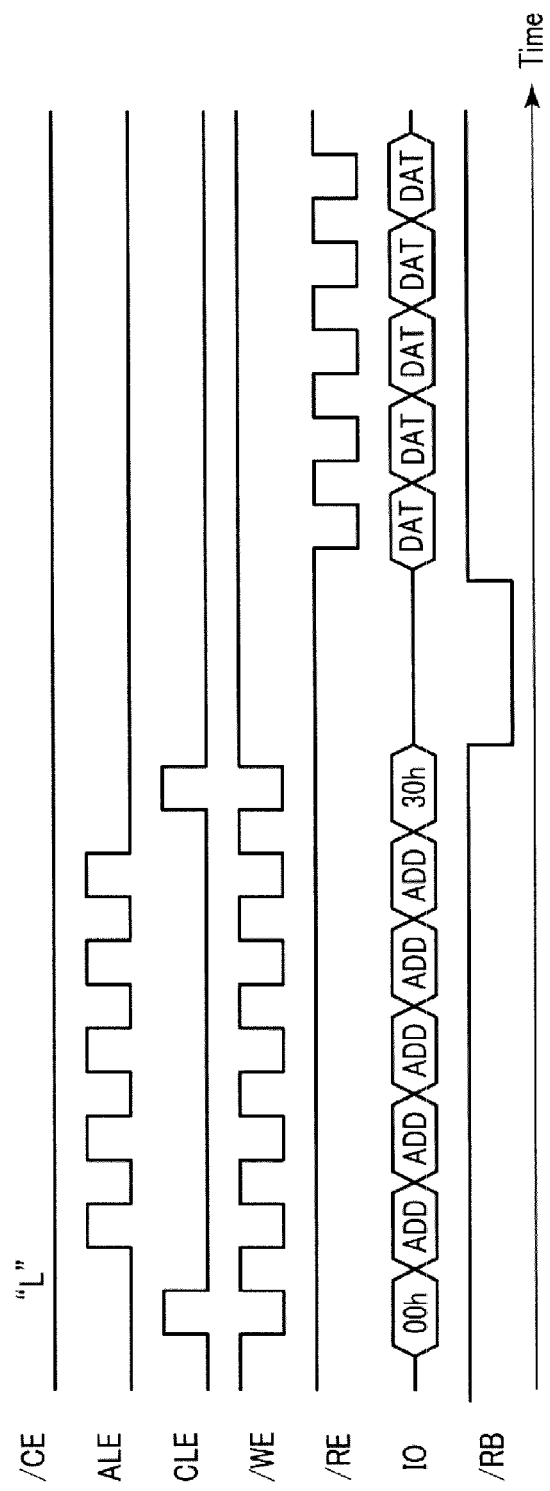

FIG. 11 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

1.2.2 Writing Operation

Next, the writing operation will be described. The writing operation includes the following three steps.

(1) Transmission of data from the host apparatus 500 to the controller 200

(2) Writing of the transmitted data to the NAND-type flash memory 100

(3) Feature table reading (Get feature): Through this step, whether writing of the data to the NAND-type flash memory 100 is passed or failed is determined.

Figure 12:
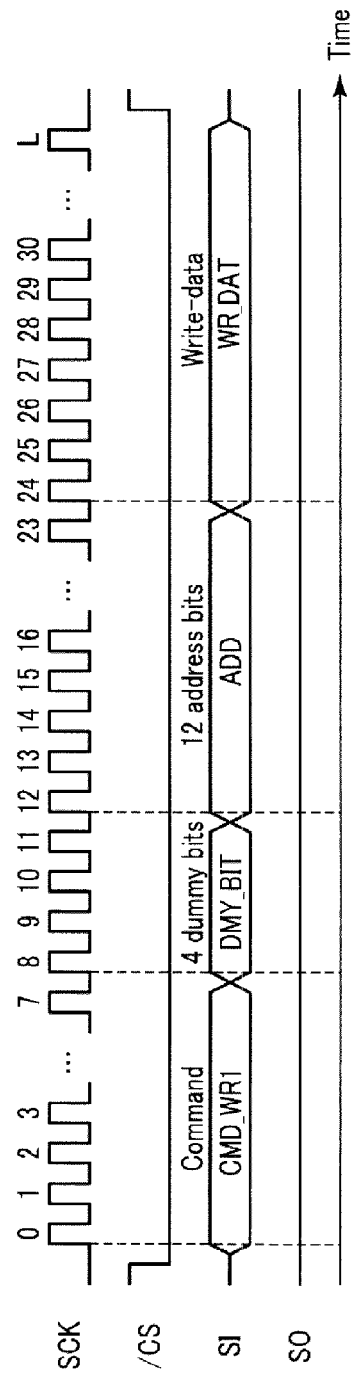
FIGS. 12-14 are timing charts of various signals during writing of data in the memory system according to the embodiment.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270, and designates a column of a page in the NAND-type flash memory 100. The address ADD is held in the address register 290. The host apparatus 500 transmits data to be written WR_DAT to the controller 200. The data to be written WR_DAT are held in the region corresponding to the address ADD received immediately before, in the data buffer 260 or 270. After the data WR_DAT is transmitted, the host apparatus 500 deasserts the signal /CS.

Figure 13:
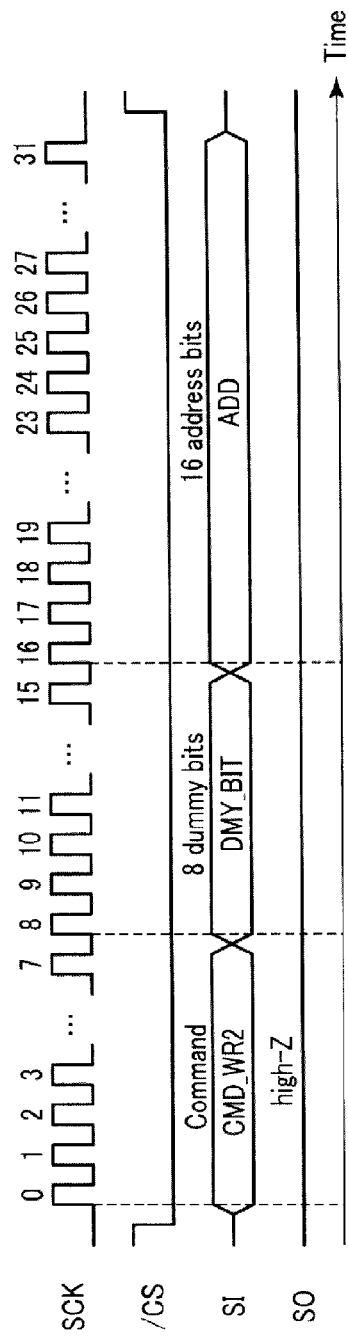

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently makes a request for information indicating whether writing of data is passed or failed.

Figure 14:
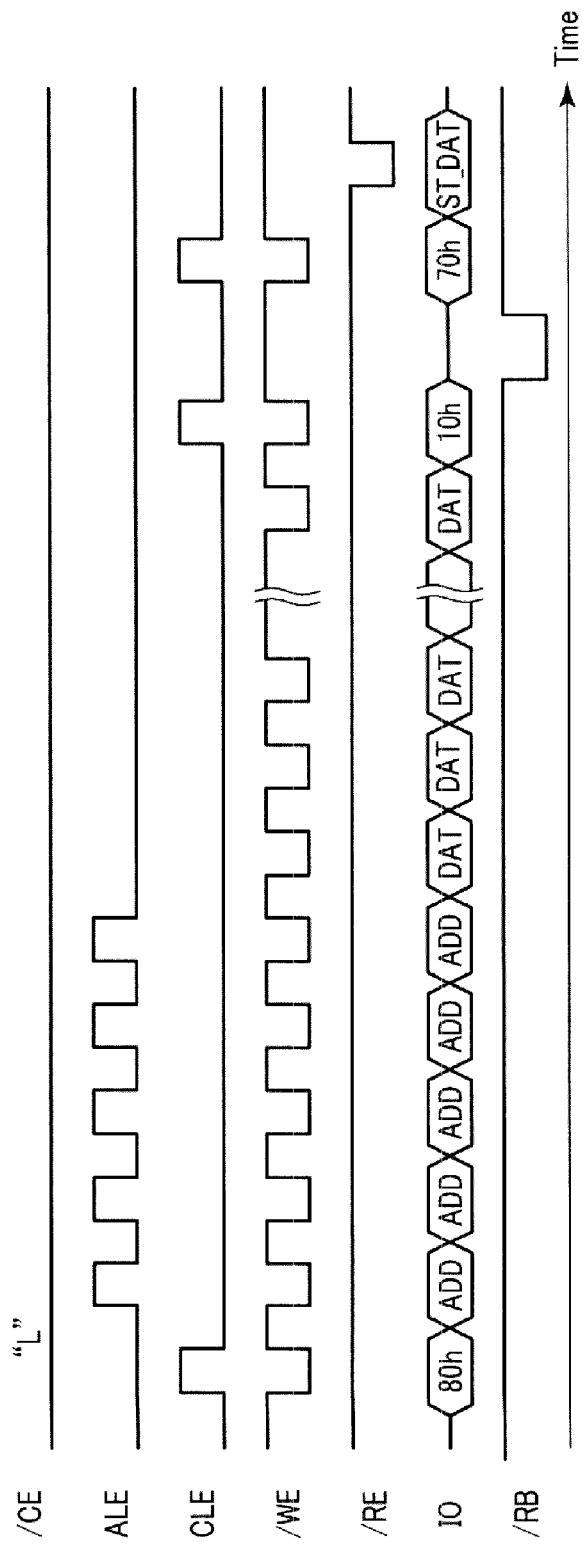

FIG. 14 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and data to be written DAT is transmitted to the NAND-type flash memory 100 for a plurality of clock cycles. Then, a write command "10h" is issued and is transmitted to the NAND-type flash memory 100. The address ADD includes addresses indicating a block, a page, and a column, held in the address register 290 in the operations illustrated in FIGS. 12 and 13.

An operation of writing the data to the memory cell array 110 is started in the NAND-type flash memory 100 in response to the command "10h", and thus the NAND-type flash memory 100 is brought into a busy state (/RB="L").

If writing of the data to the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

1.2.3 Erasing Operation

Next, the erasing operation will be described. The erasing operation includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
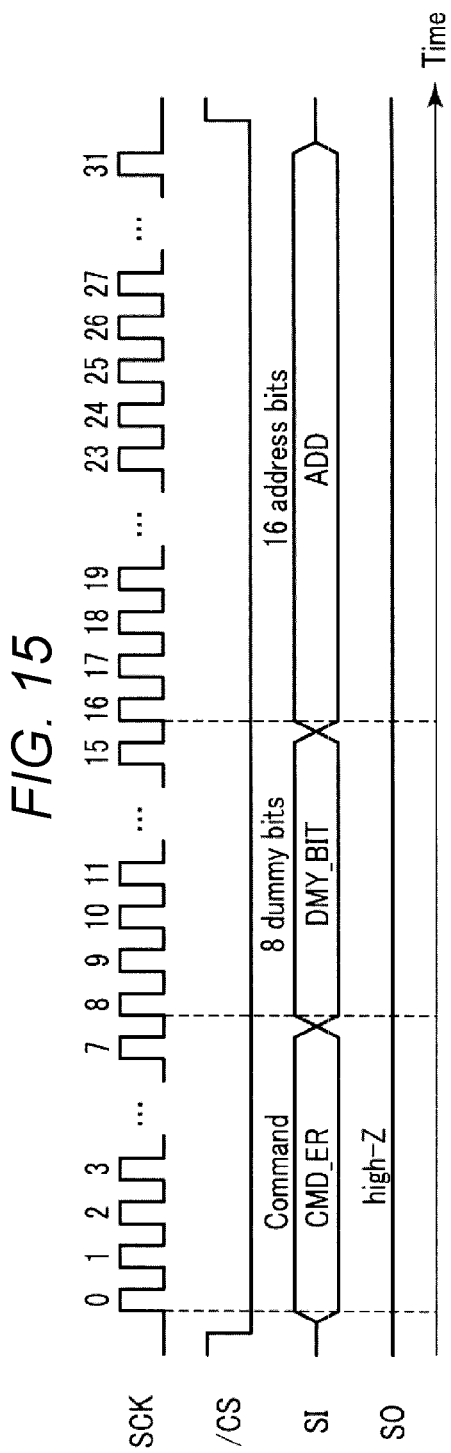
FIGS. 15-16 are timing charts of various signals during erasing of data in the memory system according to the embodiment.

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

Figure 16:
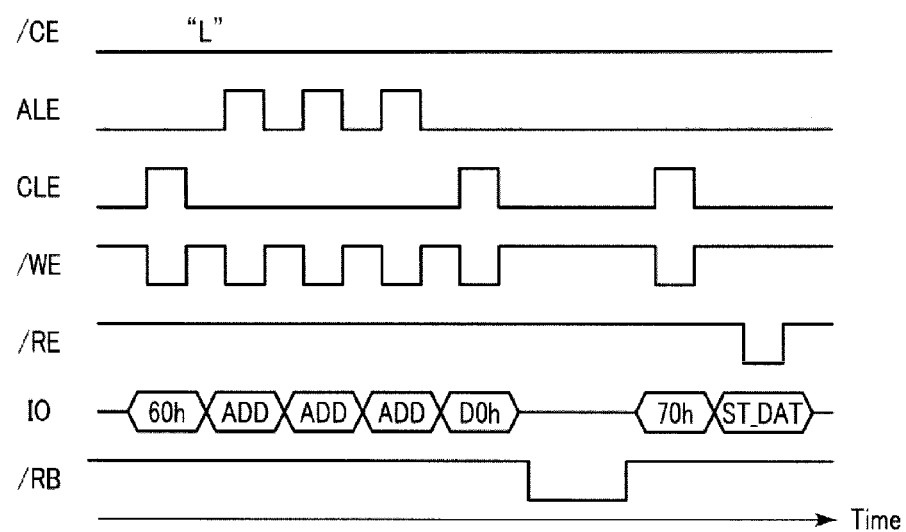

FIG. 16 is a timing chart of various signals on the NAND buses during execution of the step (1). After the erase command CMD_ER is received in the controller 200, the NAND interface circuit 230 issues a write command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 issues a status read command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

1.3 Single Unit Test of NAND-Type Flash Memory

Next, a configuration and an operation for performing a single unit test of the NAND-type flash memory 100 (hereinafter, referred to as, a NAND single unit test) according to the present embodiment will be described. The NAND single unit test is carried out to check whether or not writing, reading, erasing, and the like of data can be performed normally.

1.3.1 Configuration for Performing NAND Single Unit Test

Hereinafter, a configuration for performing the NAND single unit test will be described.

Figure 17:
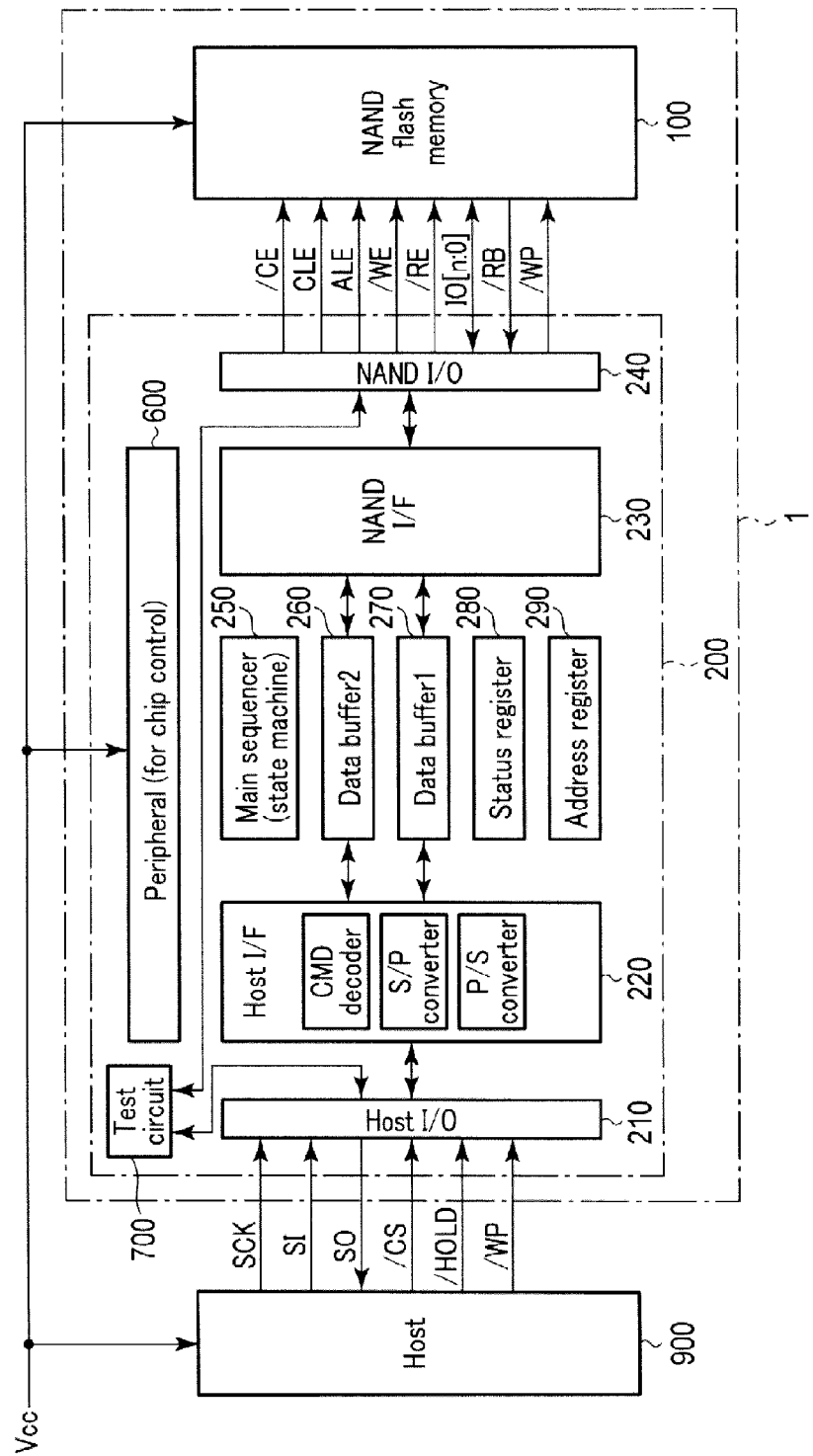
FIG. 17 is a block diagram of the memory system according to the embodiment, which includes a test circuit used to perform a single unit test of a NAND-type flash memory mounted therein.
Figure 18:
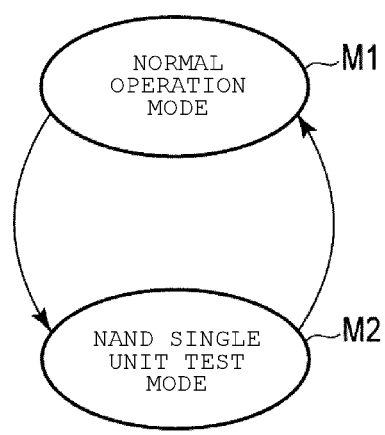
FIG. 18 conceptually illustrates operational modes of the memory system according to the embodiment.
Figure 19:
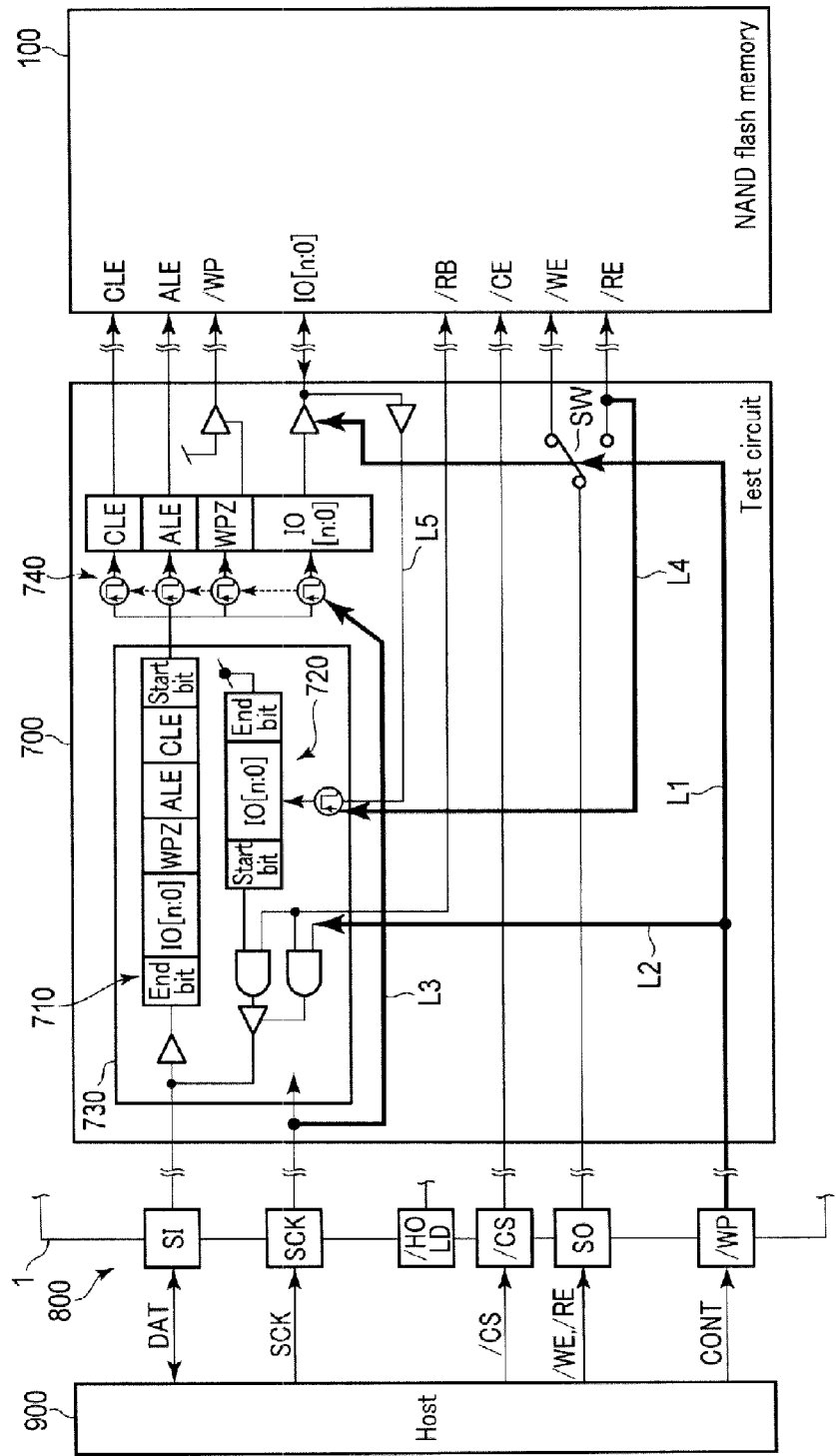
FIG. 19 illustrates the test circuit mounted in the memory system according to the embodiment.

FIG. 17 is a block diagram of the memory system 1 including a test circuit used to perform the NAND single unit test. The elements common to FIG. 6 are described with the same reference numerals. FIG. 18 conceptually illustrates operation modes of the memory system 1. FIG. 19 illustrates the test circuit mounted in the memory system 1.

Although not illustrated in FIG. 6, a test circuit 700 is provided in the memory system 1 according to the present embodiment as illustrated in FIG. 17. The test circuit 700, which is mounted in, for example, the semiconductor chip 200, is electrically connected to the host input/output circuit 210 and the NAND input/output circuit 240. The test circuit 700 is used to perform the NAND single unit test before or after shipment of the memory system 1 as a product.

When a single unit test of the NAND-type flash memory 100 is performed, a host apparatus 900 for the NAND single unit test is connected to the memory system 1 instead of the above-described host apparatus 500. The host apparatus 900 has a function of issuing various commands (data write, read, erase commands, and the like) according to predefined data formats for the NAND single unit test, and determining, displaying, and outputting a test result based on data transmitted from the NAND-type flash memory 100. When the host apparatus 900 is connected to the memory system 1 so as to perform the single unit test of the NAND-type flash memory 100, the test circuit 700 performs signal conversion between a signal (serial signal) processed by the host apparatus 900 and a signal (parallel signal) processed by the NAND-type flash memory 100.

Operational modes of the memory system 1 according to the present embodiment include, for example, a normal operation mode M1 and a NAND single unit test mode M2 (hereinafter, referred to as a test mode M2) as illustrated in FIG. 18. In the normal operation mode M1, a normal operation is performed without using the test circuit 700. In the test mode M2, the single unit test of the NAND-type flash memory 100 is performed by using the test circuit 700. Transition between the modes occurs if the memory system 1 detects a specific command or specific information at a predetermined position in serial data from the host apparatus 900.

Although not illustrated in FIG. 17, the memory system 1 has an external connection terminal unit (external connection pins) 800 as illustrated in FIG. 19. The external connection terminal unit 800 corresponds to the outer lead 330 or the inner lead 320 illustrated in FIG. 2. The test circuit 700 is connected to the inner side of the external connection terminal unit 800 via the host input/output circuit 210 illustrated in FIG. 17. The host apparatus 900 is connected to the outer side of the external connection terminal unit 800 when the single unit test of the NAND-type flash memory 100 is performed. A pin configuration of the external connection terminal unit 800 conforms to the SPI. That is, the number of pins is smaller than the number of pins of the NAND-type flash memory 100, and a signal configuration allocated to each pin is also different from the pin configuration of the NAND-type flash memory 100. The test circuit 700 includes a circuit which performs signal conversion between a signal processed by the host apparatus 900 and a signal processed by the NAND-type flash memory 100 so that the single unit test of the NAND-type flash memory 100 can be performed without any problem even if the number of pins or a signal configuration of the external connection terminal unit 800 is different from that of the NAND-type flash memory 100.

The test circuit 700 illustrated in FIG. 19 includes elements such as a data conversion unit 730 having a serial/parallel conversion circuit 710 and a parallel/serial conversion circuit 720 therein, a data latch unit 740, a switch SW, and various signal lines. For example, the test circuit 700 can convert serial data which is transmitted from the host apparatus 900 via the external connection terminal unit 800 into parallel data at a first circuit including the serial/parallel conversion circuit 710 and the data latch unit 740, and may transmit the parallel data to the NAND-type flash memory 100 side. The test circuit 700 also can convert parallel data which is transmitted from the NAND-type flash memory 100 into serial data at a second circuit including the parallel/serial conversion circuit 720 and the like, and may transmit the serial data to the external connection terminal unit 800.

Next, each pin of the external connection terminal unit 800 will be described.

The host apparatus 900 for the NAND single unit test allocates signals which are different from original signals on the SPI to some of the pins of the external connection terminal unit 800 in a state of being connected to the memory system 1.

1) Pin for SI (SI pin)

Figure 20:
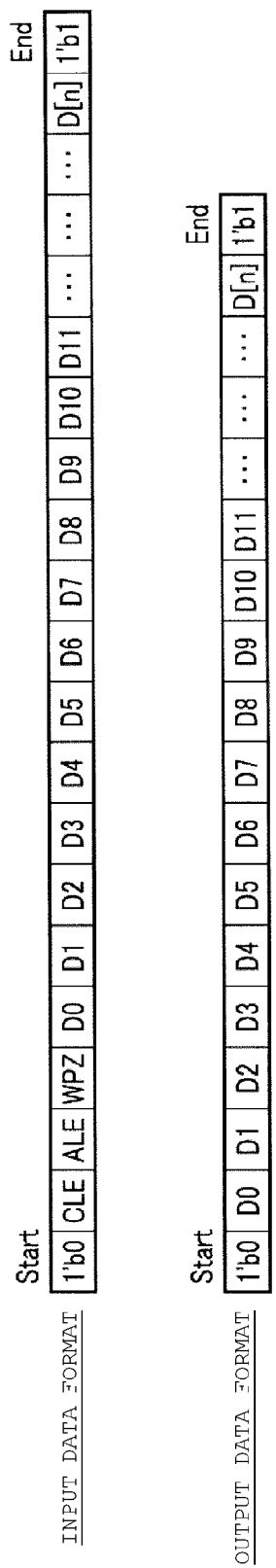
FIG. 20 schematically illustrates a format of input data input to the test circuit mounted in the memory system according to the embodiment and a format of output data output from the test circuit.

The SI pin is used to input data from the host apparatus 900 to the memory system 1 and is also used to output data from the memory system 1 to the host apparatus 900. The data which are input and output are serial data DAT, and transmitted in unit of packet. FIG. 20 illustrates examples of a format (input data format) of input data which are input to the memory system 1 and a format (output data format) of output data which are output from the memory system 1.

One packet of the input data extends from a start bit of $1'b0$ to an end bit of $1'b1$, and includes, in order, the start bit $1'b0$, a command enable bit CLE, an address enable bit ALE, a write protect bit WPZ, n data bits D0 to Dn, and the end bit $1'b1$.

One packet of the output data extends from the start bit $1'b0$ to the end bit of $1'b1$, and includes in order, the start bit $1'b0$, n data bits D0 to Dn, and the end bit $1'b1$.

2) Pin for /WP (/WP Pin)

The /WP pin is used to supply a control signal CONT for switching an input mode and an output mode from the host apparatus 900 to the memory system 1. In the input mode, serial data supplied from the host apparatus 900 are input to the NAND-type flash memory 100 as parallel data. In the output mode, parallel data output from the NAND-type flash memory 100 are output to the host apparatus 900 as serial data. During the input mode, the switch SW and a part of the data latch unit 740 are operated in accordance with the control signal CONT (for example, an "H" level) transmitted via a signal line L1, so that a write enable signal can be supplied to and data can be input to the NAND-type flash memory 100. During the output mode, the switch SW and a part of the parallel/serial conversion circuit 720 are operated in accordance with the control signal CONT (for example, an "L" level) transmitted via signal lines L1 and L2, so that a read enable signal can be supplied to the NAND-type flash memory 100, and data can be output to the host apparatus 900.

3) Pin for SCK (SCK Pin)

The SCK pin is used to supply the clock signal SCK from the host apparatus 900 to the memory system 1. The clock signal SCK input to the memory system 1 is supplied to the data conversion unit 730, and the data latch unit 740 via a signal line L3.

4) Pin for /HOLD (/HOLD Pin)

The /HOLD pin is not used here.

5) Pin for /CS (/CS Pin)

The /CS pin is used to supply the chip select signal /CS from the host apparatus 900 to the memory system 1.

6) Pin for SO (SO Pin)

The SO pin is used to supply the write enable signal /WE or the read enable signal /RE from the host apparatus 900 to the memory system 1. In other words, the SO pin is used to transmit both of the write enable signal /WE and the read enable signal /RE.

1.3.2 Operation During NAND Single Unit Test

Hereinafter, an operation during the NAND single unit test will be described.

The NAND single unit test is performed by a manufacturer or a maintenance provider in a state in which the memory system 1 is connected to the host apparatus 900 for the NAND single unit test before or after shipment of the memory system 1 as a product.

When serial data are supplied from the host apparatus 900 to the memory system 1, a specific command or specific information is included at a predetermined position of the serial data. Using the specific command, the memory system 1 can be made to transition from the normal operation mode M1 to the test mode M2 or from the test mode M2 to the normal operation mode M1. For example, in the normal operation mode M1, if the specific command is input according to the same sequence as in the data format conforming to the SPI protocol illustrated in FIG. 8, the memory system 1 recognizes the command as a command instructing the NAND single unit test, and transitions from the normal operation mode M1 to the test mode M2. On the other hand, in the test mode M2, if CLE is set as 1, and ALE is set as 1 in the input data format illustrated in FIG. 20, the memory system 1 recognizes the command as a command indicating that the NAND single unit test is finished, and transitions from the test mode M2 to the normal operation mode M1.

The memory system 1 may hold information indicating whether a current operation mode is the normal operation mode M1 or the test mode M2, in a predetermined storage area. In this case, the information regarding the operation modes is managed by, for example, the sequencer 250 or other controllers.

A data format of the serial data transmitted by the host apparatus 900 for the NAND single unit test is a predefined data format dedicated for the NAND single unit test, and is confidential information securely managed by the manufacturer or the maintenance provider of the memory system 1. Therefore, a general user cannot perform the NAND single unit test by connecting the above-described host apparatus 500 to the memory system 1.

Figure 21:
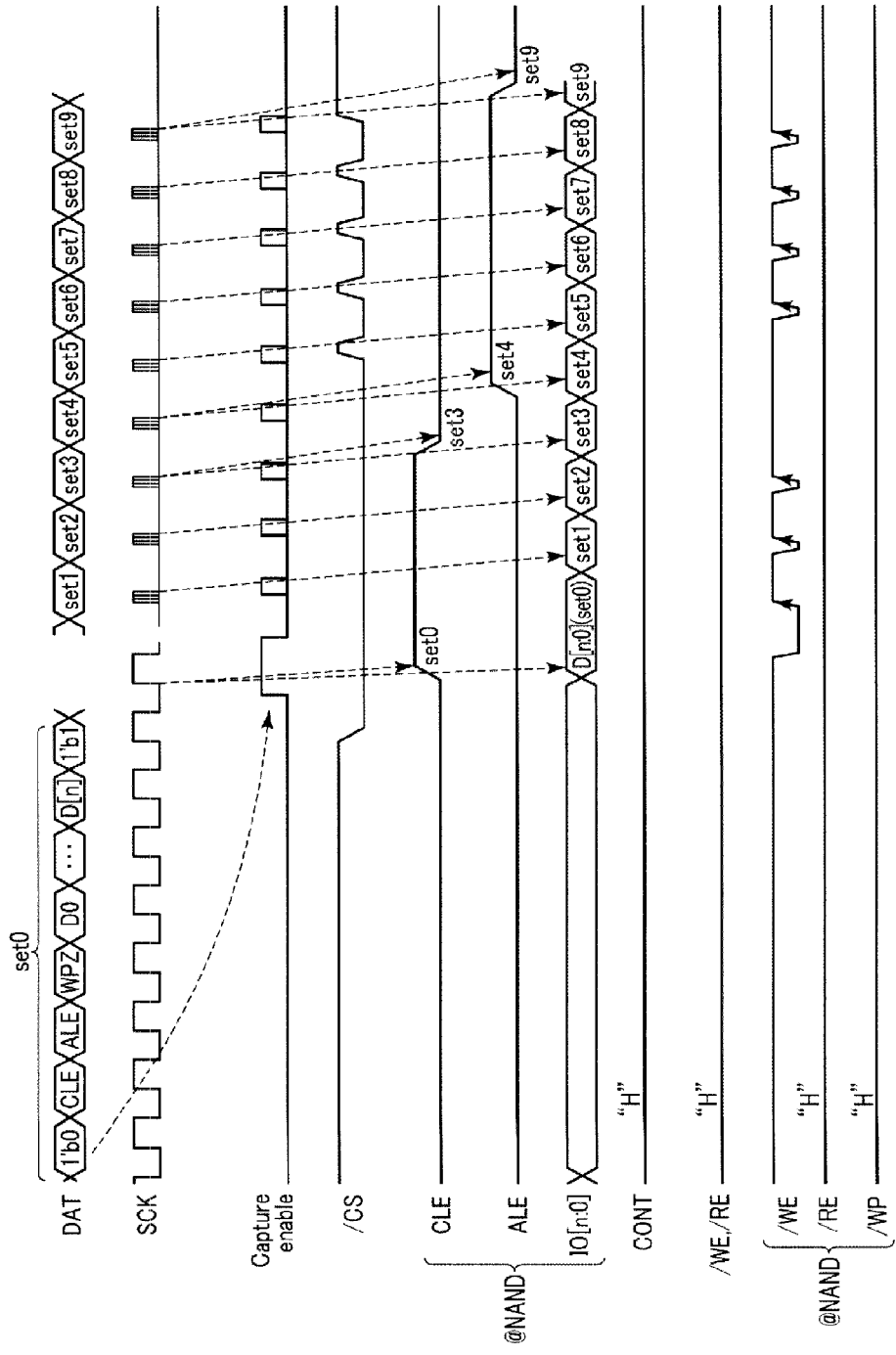
FIG. 21 is a timing chart illustrating a writing operation carried out in a testing mode of the memory system according to the embodiment.

Next, a data input operation during the test mode M2 will be described with reference to FIGS. 19 and 21.

Here, it is assumed that a write command is supplied from the host apparatus 900 to the NAND-type flash memory 100 via the test circuit 700.

The host apparatus 900 supplies the control signal CONT having an "H" level to the /WP pin of the external connection terminal unit 800. Consequently, the switch SW and a part of the data latch unit 740 of the test circuit 700 are operated via the signal line L1, so that the write enable signal /WE can be supplied to and data can be input to the NAND-type flash memory 100, thereby establishing an input mode.

The host apparatus 900 supplies the write enable signal /WE having an "H" level to the SO pin of the external connection terminal unit 800. This signal is then supplied to the NAND-type flash memory 100.

The host apparatus 900 supplies the clock signal SCK to the SCK pin of the external connection terminal unit 800. This signal is then supplied to the data conversion unit 730, and to the data latch unit 740 via the signal line L3.

The host apparatus 900 supplies the serial data DAT based on the input data format illustrated in FIG. 20, to the SI pin of the external connection terminal unit 800. The serial data DAT include not only actual data (write data) but also command information, address information, or write protect information. For example, the command information is supplied first, and then the address information is supplied.

When the command information is supplied as the serial data DAT, serial data set0 corresponding to one packet is first supplied. In the serial data set0, CLE is set as 1, ALE is set as 0, WPZ is set as 0, and the data bits D0 to Dn [n:0] corresponding to actual data IO are set as values of a command (for example, values of a write command). The serial data set0 is supplied to the serial/parallel conversion circuit 710 and converted into parallel data.

Next, the host apparatus 900 supplies the chip select signal /CS having an "L" level to the /CS pin of the external connection terminal unit 800 at a timing at which the supply of the data set0 is completed. Consequently, data can be input to the NAND-type flash memory 100 (an input data capture enable state).

The data latch unit 740 supplies the actual data IO in the data set0 and the signal CLE having an "H" level to the NAND-type flash memory 100 at a timing at which the clock signal SCK changes from an "L" level to an "H" level according to clock signal SCK. At this time, if the write enable signal /WE supplied from the SO pin of the external connection terminal unit 800 is changed from an "L" level to an "H" level, the NAND-type flash memory 100 receives the actual data IO in the data set0 and the signal CLE having an "H" level supplied from the test circuit 700. The, the NAND-type flash memory 100 performs a process corresponding to the command (for example, a write command).

Thereafter, if remaining command information is further continuously supplied, data items set1, set2, . . . are processed and supplied to the NAND-type flash memory 100 in the same procedure as in the data set0.

Next, the host apparatus 900 supplies the address information as the serial data DAT. When the address information is supplied, for example, data items set4, set5, . . . are input to the NAND-type flash memory 100 through the same procedure as when the command information is supplied. For example, in the data set4, CLE is set as 0, ALE is set as 1, WPZ is set as 0, and the data bits D0 to Dn [n:0] corresponding to actual data IO are set as address values. This is also the same for the data set5 and the subsequent data sets.

Here, data are input in accordance with the write command, but data may be input in accordance with a read command through the same procedure. In this case, the data bits D0 to Dn [n:0] in the serial data DAT supplied by the host apparatus 900 are set as values of the read command.

Figure 22:
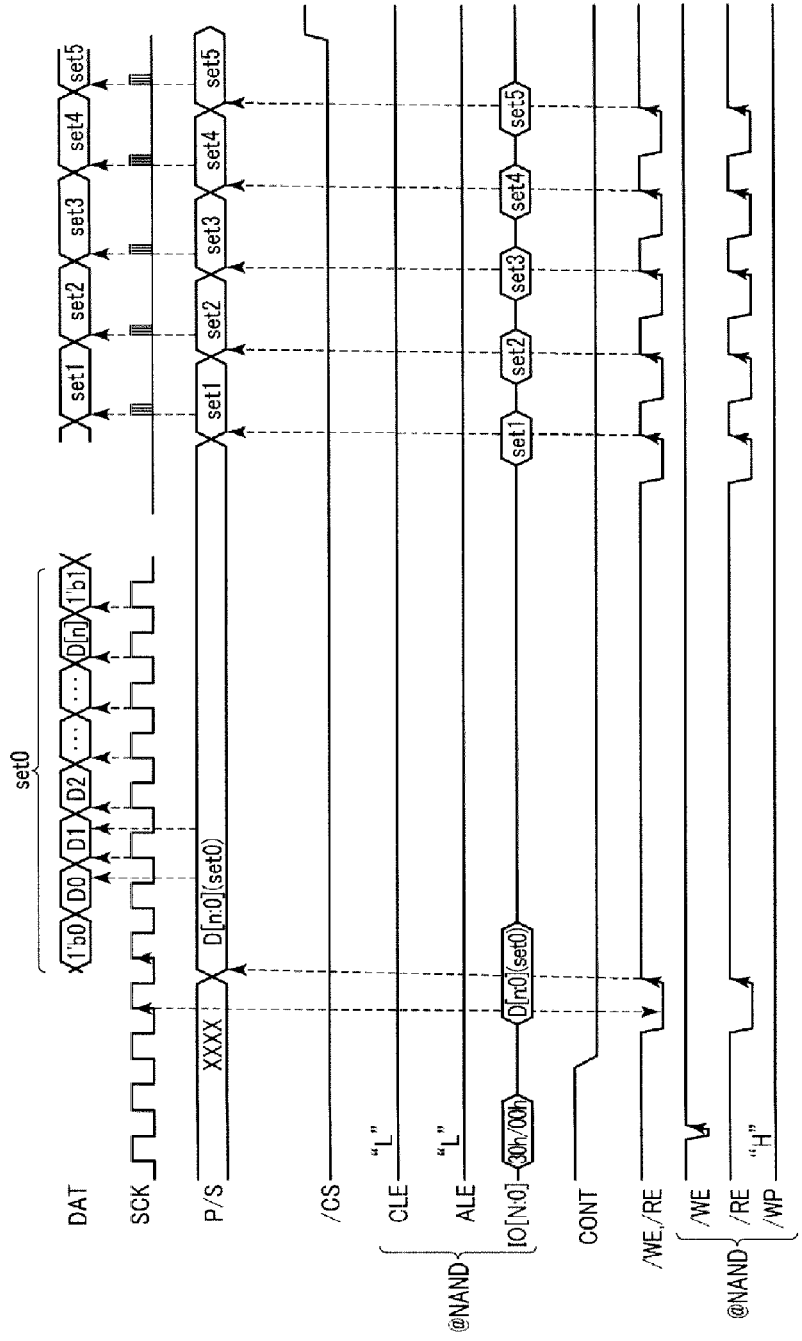
FIG. 22 is a timing chart illustrating a reading operation carried out in a testing mode of the memory system according to the embodiment.

Next, a specific operation of outputting data during the test mode M2 will be described with reference to FIGS. 19 and 22.

Here, it is assumed that a read command is supplied to the NAND-type flash memory 100, and data are supplied from the NAND-type flash memory 100 to the host apparatus 900 via the test circuit 700 in response thereto.

The host apparatus 900 supplies the chip select signal /CS having an "L" level to the /CS pin of the external connection terminal unit 800.

The host apparatus 900 changes the write enable signal /WE supplied via the SO pin of the external connection terminal unit 800 from an "L" level to an "H" level. At this time, a read/address input command (30h/00h) which is already converted into a parallel signal in the test circuit 700 is supplied from the data latch unit 740 to the NAND-type flash memory 100.

Thereafter, the host apparatus 900 supplies the control signal CONT having an "L" level to the /WP pin of the external connection terminal unit 800. Consequently, the switch SW and a part of the data latch unit 740 of the test circuit 700 are operated via the signal line L1, so that the read enable signal /RE can be supplied to the NAND-type flash memory 100, and data can be output to the host apparatus 900.

The host apparatus 900 supplies the clock signal SCK to the SCK pin of the external connection terminal unit 800. This signal is supplied to the data conversion unit 730 (the parallel/serial conversion circuit 720 and the like).

The host apparatus 900 supplies the read enable signal /RE having an "L" level to the SO pin of the external connection terminal unit 800. This signal is then supplied to the NAND-type flash memory 100 and to a part of the parallel/serial conversion circuit 720 via the signal line L4. At this time, in the NAND-type flash memory 100, the read enable signal /RE is in an "L" level, and, for example, parallel data IO [n:0] read from a designated storing area are supplied to the test circuit 700. The parallel data IO [n:0] are supplied to a part of the parallel/serial conversion circuit 720 via the signal line L5.

The parallel/serial conversion circuit 720 receives the parallel data IO [n:0] supplied via the signal line L5 at a timing at which the read enable signal /RE is brought into an "H" level according to the read enable signal /RE having an "L" level, which is supplied via the signal line L4, and generates serial data of one packet in which the parallel data IO [n:0] is located between the start bit $1'b0$ and the end bit $1'b1$. The parallel/serial conversion circuit 720 outputs the generated serial data according to the clock signal SCK.

The memory system 1 supplies the serial data output from the parallel/serial conversion circuit 720, to the host apparatus 900 via the SI pin of the external connection terminal unit 800. The host apparatus 900 which received the serial data checks whether or not the NAND-type flash memory 100 operates normally based on the serial data.

1.4 Advantage of Present Embodiment

According to the present embodiment, the memory can be tested using the terminal unit 800 having the number of pins smaller than the number of pins of the memory. The advantage of the present embodiment will be described below in detail.

Generally, the memory system employs a package having a small number of pins so as to communicate with the host apparatus with a simpler configuration. In this case, since the number of pins is small, a signal allocated to each pin of the memory cannot be output to an external device, and thus a single unit test of the memory cannot be tested or test content is restricted.

In terms of this fact, according to the present embodiment, even if the number of pins smaller than the number of pins of the memory is employed in the external connection terminal unit of the memory system (for example, a package having a small number of pins is employed), since the test circuit is provided in the memory system, a single unit test of the memory can be performed without providing separate dedicated pins.

2. Modification Examples and the Like

Figure 23:
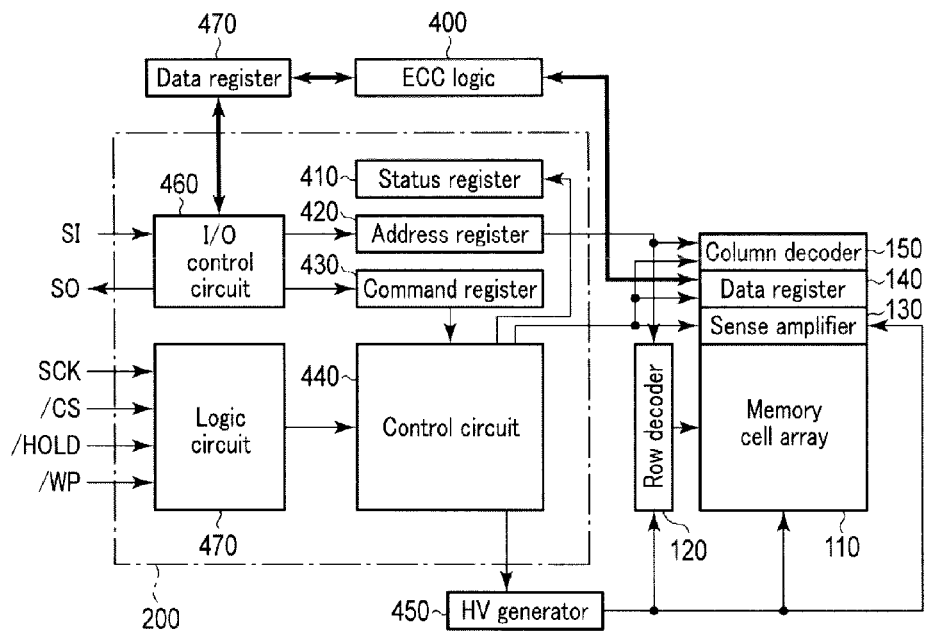
FIG. 23 is a block diagram of a memory system according to a modification example of the embodiment.

Embodiments are not limited to the above-described embodiment and may have various modifications. For example, in the above-described embodiment, the NAND-type flash memory 100, the controller chip 200, and the test circuit 700 are formed on separate semiconductor chips. Alternatively, the elements may be formed of one chip. FIG. 23 is a block diagram of the memory system 1 having the elements on one chip. Although the test circuit 700 is not illustrated in FIG. 23, the test circuit 700 is included in the memory system 1 similarly to the one illustrated in FIG. 17.

As illustrated, a block configuration is the same as in FIG. 7, but the signals SCK, /CS, /HOLD, and /WP from the host apparatus 500 are input to the logic circuit 470, and the signals SI and SO are input and output via the input/output control circuit 460. The registers 410 and 430, the control circuits 440 and 460, and the logic circuit 470 function as the controller 200. In other words, the control circuit 440 functions as the sequencer 250 and the host interface circuit 220, and discriminates commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like.

Figure 24:
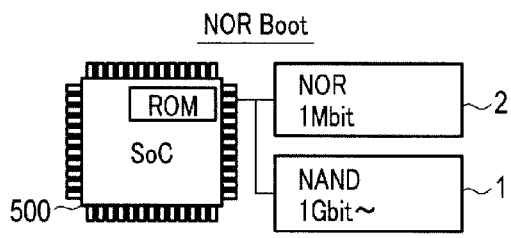
FIGS. 24 and 25 are each a conceptual diagram of a system using the memory system according to the embodiment.

The memory systems described in each of the above embodiments may be applied to, for example, a television set or a set top box. FIG. 24 illustrates an example of such a system. In this example, a NOR-type flash memory 2 is provided in addition to the memory system 1. Both the memory system 1 and the NOR-type flash memory 2 are connected to an SPI interface. In this example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. The host apparatus 500 reads an activation sequence from the memory system 1 by using the command information, and the application is activated by executing the activation sequence.

Figure 25:
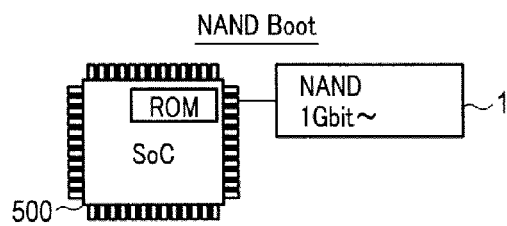

Alternatively, if the command information regarding the memory system 1 is held in the ROM of the host apparatus 500, the NOR-type flash memory 2 may be omitted as illustrated in FIG. 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a semiconductor memory device;
a controller configured to control the semiconductor memory device;
a plurality of first pins for connection to the outside of the memory system, the plurality of first pins conforming to a first interface protocol;
a plurality of second pins conforming to a second interface protocol, a number of the first pins being smaller than a number of second pins; and
a test circuit, wherein
when one of the first pins receives a serial signal including serial test data and control data, and the control data indicates to assert a first control signal on one of the second pins,
the test circuit converts the serial test data into parallel test data, and outputs the parallel test data to the semiconductor memory device for writing therein.

2. The memory system according to claim 1, wherein
the memory system is configured to operate in a plurality of operational modes, including a normal mode and a test mode, and
the controller processes serial data received through one of the first pins when the memory system operates in the normal mode, and the controller allows the test circuit, instead of the controller, to process the serial data, when the memory system operates in the test mode.

3. The memory system according to claim 2, wherein
when the serial data received through one of the first pins are in a first data sequence format and include a first predetermined value, the operational mode is switched to the test mode.

4. The memory system according to claim 3, wherein
when the serial data received through one of the first pins are in a second data sequence format and include a second predetermined value, the operational mode is switched to the normal mode.

5. The memory system according to claim 1, wherein
the first pin that receives the serial test data for writing in the semiconductor memory device is the same as the first pin through which the serial test data for test are output.

6. The memory system according to claim 1, wherein
the first control signal is a write enable signal,
when the first control signal is asserted, the test circuit outputs the parallel test data to the semiconductor memory device for writing therein, and
when the first control signal is deasserted, the test circuit outputs the serial test data for test through said one of the first pins.

7. The memory system according to claim 6, wherein
another one of the first pins is configured to receive a second control signal, and
when the first control signal is asserted, the test circuit outputs the second control signal to the semiconductor memory device as a write enable signal, and
when the first control signal is deasserted, the test circuit outputs the second control signal to the semiconductor memory device as a read enable signal.

8. The memory system according to claim 1, wherein
the first interference protocol is a Serial Peripheral Interface (SPI) protocol, and
the second interference protocol is a NAND interface protocol.

9. The memory system according to claim 1, wherein
the one of the first pins which receives the serial test data further receives command information and address information,
the test circuit outputs a command latch enable signal and an address latch enable signal to the semiconductor memory device,
the command information indicates a logical state of the command latch enable signal when the parallel test data are output to the semiconductor memory device, and
the address information indicates a logical state of the address latch enable signal when the parallel test data are output to the semiconductor memory device.

10. A method for testing a memory system including a semiconductor memory device, the method comprising:
transmitting serial test data and control data through one of a plurality of first pins of the memory system, the plurality of first pins conforming to the a first interface protocol;
converting, in the memory system, the serial test data to parallel test data;
when the control data indicates to assert a control signal on one of a plurality of second pins conforming to a second interface protocol, a number of the first pins being smaller than a number of second pins, writing the parallel test data in the semiconductor memory device;
reading the parallel test data written in the semiconductor memory device;
converting the read parallel test data to serial test data;
receiving, from the memory system, the serial test data that has been converted from the read parallel test data; and
comparing the transmitted serial test data and the received serial test data.

11. The method according to claim 10, wherein
the memory system is configured to operate in a plurality of operational modes, including a normal mode and a test mode, and
the method is carried out during the test mode.

12. The method according to claim 11, further comprising:
switching the operational mode to the test mode, by transmitting through said one of the first pins to the memory system the serial test data that is in a first data sequence format and includes a first predetermined value.

13. The method according to claim 12, further comprising:
switching the operational mode to the normal mode, by transmitting through said one of the first pins to the memory system serial data that is in a second data sequence format and includes a second predetermined value.

14. The method according to claim 10, wherein
the first pin through which the serial test data are transmitted to the memory system is the same as the first pin through which the serial test data are received from the memory system.

15. The method according to claim 10, wherein
the first interface protocol is a Serial Peripheral Interface (SPI) protocol, and
the second interference protocol is a NAND interface protocol.

16. The method according to claim 10, further comprising:
transmitting command information and address information through said one of the first pins through which the serial test data are transmitted; and
outputting a command latch enable signal and an address latch enable signal to the semiconductor memory device, wherein
the command information indicates a logical state of the command latch enable signal when the parallel test data are output to the semiconductor memory device, and
the address information indicates a logical state of the address latch enable signal when the parallel test data are output to the semiconductor memory device.

17. A memory system, comprising:
a semiconductor memory device;
a plurality of first pins for connection to the outside of the memory system, the first pins conforming to a first interface protocol and configured to receive and output serial data;
a plurality of second pins conforming to a second interface protocol, a number of the first pins being smaller than a number of second pins;
a first serial/parallel conversion circuit configured to convert first serial data in a first data sequence format, which are received through one of the first pins, to first parallel data for writing in the semiconductor memory device, when the memory system operates in a first mode; and
a second serial/parallel conversion circuit configured to convert second serial data in a second data sequence format, which are received through one of the first pins, to second parallel data for writing in the semiconductor memory device, when the memory system operates in a second mode.

18. The memory system according to claim 17, wherein the first serial/parallel conversion circuit is further configured to convert first parallel data read from the semiconductor memory device to serial data in the first data sequence format for output to the outside of the memory system through one of the first pins, and the second serial/parallel conversion circuit is further configured to convert second parallel data read form the semiconductor memory device to serial data in the second data sequence format for output to the outside of the memory system through one of the first pins.

19. The memory system according to claim 17, wherein the first serial data in the first data sequence format are test data for testing the memory system, and the second serial data in the second data sequence format are stored in the memory system.

20. The memory system according to claim 17, wherein a command to change an operational mode of the memory system to the second mode is received through said one of the first pins, as serial data in the first data sequence format, and a command to change the operational mode to the first mode is received through said one of the first pins, as serial data in the second data sequence format.

* * * * *